(12) United States Patent
Zhang

(10) Patent No.: US 10,269,422 B2
(45) Date of Patent: Apr. 23, 2019

(54) STORAGE SYSTEM WITH DATA RELIABILITY MECHANISM AND METHOD OF OPERATION THEREOF

(71) Applicant: CNEX LABS, Inc., San Jose, CA (US)

(72) Inventor: Xiaojie Zhang, Saratoga, CA (US)

(73) Assignee: CNEX LABS, Inc., San Jose, CA (US)

( * ) Notice: Subject to any disclaimer, the term of this patent is extended or adjusted under 35 U.S.C. 154(b) by 0 days.

(21) Appl. No.: 15/699,886

(22) Filed: Sep. 8, 2017

(65) Prior Publication Data

US 2019/0080751 A1 Mar. 14, 2019

(51) Int. Cl.
| | | |
|---|---|---|
| *G11C 29/10* | (2006.01) | |
| *G11C 11/56* | (2006.01) | |
| *G06F 11/10* | (2006.01) | |
| *G11C 16/26* | (2006.01) | |
| *G11C 16/08* | (2006.01) | |
| *G06F 11/07* | (2006.01) | |
| *G11C 13/00* | (2006.01) | |
| *H03M 13/11* | (2006.01) | |
| *H03M 13/00* | (2006.01) | |
| *G11C 16/34* | (2006.01) | |
| *G11C 29/52* | (2006.01) | |

(52) U.S. Cl.
CPC ........ *G11C 11/5642* (2013.01); *G06F 11/073* (2013.01); *G06F 11/1072* (2013.01); *G11C 16/08* (2013.01); *G11C 16/26* (2013.01); *G11C 16/3418* (2013.01); *G11C 29/10* (2013.01); *G11C 29/52* (2013.01); *G11C 2013/0057* (2013.01); *H03M 13/1111* (2013.01); *H03M 13/6325* (2013.01)

(58) Field of Classification Search
CPC ..... G11C 11/5642; G11C 16/08; G11C 16/26; G11C 16/3418; G11C 29/10; G11C 29/52; G11C 2013/0057; G06F 11/073; G06F 11/1072; H03M 13/1111; H03M 13/6325
USPC ..... 365/189.09, 185.03, 185.09, 189.07, 200
See application file for complete search history.

(56) References Cited

U.S. PATENT DOCUMENTS

| | | | | |
|---|---|---|---|---|
| 7,853,837 | B2 * | 12/2010 | Perego | G01R 31/31709 365/200 |
| 8,347,154 | B2 * | 1/2013 | Bahali | G06F 11/008 365/200 |
| 8,427,867 | B2 * | 4/2013 | Weingarten | G06F 11/1068 365/185.02 |
| 8,996,838 | B1 * | 3/2015 | D'Abreu | G11C 16/0466 365/185.12 |
| 9,633,740 | B1 | 4/2017 | Alhussien et al. | |
| 9,640,270 | B2 | 5/2017 | Alrod et al. | |

(Continued)

*Primary Examiner* — Tan T. Nguyen
(74) *Attorney, Agent, or Firm* — Perspectives Law Group, Corp.

(57) ABSTRACT

A storage system includes: a control processor unit, configured to: initiate a read of a raw data page, having correctable errors, calculate a raw bit error rate (RBER) (EQ1) by correcting the correctable errors to become corrected data and comparing raw data with the corrected data, and calculate a correction model characterization based on the RBER (EQ1); and a non-volatile storage array, coupled to the control processor unit, configured to store a processed data page in a physical block with the raw data page; and wherein the control processor unit is further configured to apply the correction model characterization to the raw data page in the physical block.

30 Claims, 5 Drawing Sheets

(56) References Cited

U.S. PATENT DOCUMENTS

| | | | |
|---|---|---|---|
| 9,659,637 B2 | 5/2017 | Song et al. | |
| 9,685,243 B2 | 6/2017 | Parthasarathy et al. | |
| 2004/0136236 A1* | 7/2004 | Cohen | G11C 11/5642 365/185.2 |
| 2008/0244368 A1* | 10/2008 | Chin | G06F 11/1072 714/800 |
| 2009/0213653 A1* | 8/2009 | Perlmutter | G11C 11/5628 365/185.03 |
| 2010/0177564 A1* | 7/2010 | Feeley | G06F 11/1068 365/185.09 |
| 2010/0332894 A1* | 12/2010 | Bowers | G06F 11/1008 714/6.13 |
| 2014/0204671 A1* | 7/2014 | Sharon | G11C 11/5642 365/185.09 |
| 2014/0301142 A1* | 10/2014 | Stoev | G11C 16/3454 365/185.09 |
| 2015/0085571 A1* | 3/2015 | Hu | G11C 16/26 365/185.03 |
| 2018/0011753 A1* | 1/2018 | Alhussien | G06F 11/1012 |

* cited by examiner

STORAGE SYSTEM WITH DATA RELIABILITY MECHANISM AND METHOD OF OPERATION THEREOF

TECHNICAL FIELD

An embodiment of the present invention relates generally to a storage system, and more particularly to a system for data reliability.

BACKGROUND

The proliferation of intelligent devices in our everyday lives has driven the evolution of nonvolatile memory, such as NAND flash, to support those devices. In order to reduce the cost per gigabyte NAND flash, memory devices have become denser by packing more data in the same silicon area, by scaling the size of the flash cells, and storing more bits in each of them, but this cell-size shrinkage has come at the cost of read back reliability. A mechanism must be found to provide the desired data reliability while minimizing the repetitive reads of the NAND flash page.

Thus, a need still remains for a storage system with data reliability mechanism to provide improved data reliability and recovery. In view of the ever-increasing commercial competitive pressures, along with growing consumer expectations and the diminishing opportunities for meaningful product differentiation in the marketplace, it is increasingly critical that answers be found to these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

SUMMARY

An embodiment of the present invention provides an apparatus, including a control processor unit, configured to: initiate a read of a raw data page, having correctable errors; a read/write channel, coupled to the control processor unit, configured to: calculate a raw bit error rate (RBER) by correcting the correctable errors to become corrected data and comparing raw data with the corrected data, and calculate a correction model characterization based on the RBER; and a non-volatile storage array, coupled to the read/write channel, configured to store the processed data page in a physical block with the raw data page; and wherein the read/write channel is further configured to apply the correction model characterization to the raw data page in the physical block.

An embodiment of the present invention provides a method including: initiating a read of a raw data page, including correctable errors; calculating a raw bit error rate (RBER) by correcting the correctable errors in raw data to become corrected data and comparing raw data with the corrected data; calculating a correction model characterization based on the RBER; and applying the correction model characterization to the raw data page in a physical block.

An embodiment of the present invention provides a non-transitory computer readable medium including: initiating a read of a raw data page, including correctable errors; calculating a raw bit error rate (RBER) by correcting the correctable errors in raw data to become corrected data and comparing raw data with the corrected data; calculating a correction model characterization based on the RBER; and applying the correction model characterization to the raw data page in a physical block.

Certain embodiments of the invention have other steps or elements in addition to or in place of those mentioned above. The steps or elements will become apparent to those skilled in the art from a reading of the following detailed description when taken with reference to the accompanying drawings.

DETAILED DESCRIPTION

Figure 1:
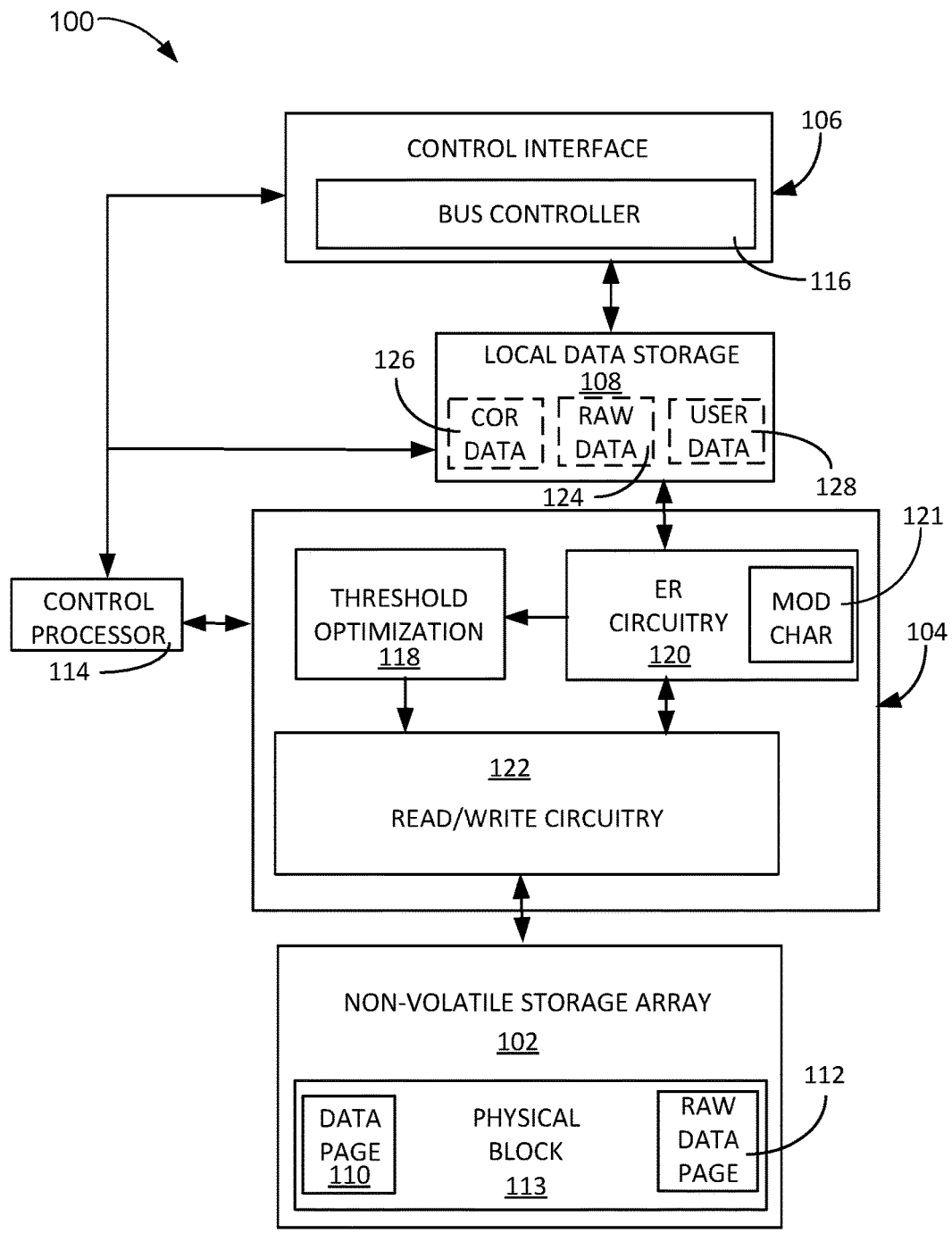
FIG. 1 is a storage system with data reliability mechanism in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of an embodiment of the present invention.

In the following description, numerous specific details are given to provide a thorough understanding of the invention. However, it will be apparent that the invention may be practiced without these specific details. In order to avoid obscuring an embodiment of the present invention, some well-known circuits, system configurations, and process steps are not disclosed in detail.

The drawings showing embodiments of the system are semi-diagrammatic, and not to scale and, particularly, some of the dimensions are for the clarity of presentation and are shown exaggerated in the drawing figures. Similarly, although the views in the drawings for ease of description generally show similar orientations, this depiction in the figures is arbitrary for the most part. Generally, the invention can be operated in any orientation.

The term "module" referred to herein can include hardware or hardware supported by software in an embodiment of the present invention in accordance with the context in which the term is used. For example, the software can be machine code, firmware, embedded code, and application software. Also for example, the hardware can be circuitry, processor, computer, integrated circuit, integrated circuit cores, passive devices, or a combination thereof.

As an example, one method to recover data is to use advanced signal processing algorithms re-reads and post-read signal processing. For example, all post-read signal processing algorithms require re-reads using different thresholds, which will be further transferred in to log likelihood ratio (LLR) of each bit for post processing such as Low Density Parity Check (LDPC), soft decoding, etc. It is understood that the re-read of a data page can increase the bit error rate of the data page due to depletion of charge and charge redistribution in the data page and the physical block storing the data page.

Referring now to FIG. 1, therein is shown a functional block diagram of a storage system 100 with data reliability mechanism in an embodiment of the present invention. The functional block diagram of the storage system 100 depicts a non-volatile memory array 102 coupled to a read/write channel 104. A control interface 106 can manage the read/write channel 104 and a local data storage 108 by enabling the transport of user data 128 into the local data storage 108 or enabling corrected data 126 to be transported from the local data storage 108 to a system host (not shown). The local data storage 108 can be a volatile memory array, such as a matrix of interconnected volatile memory integrated circuits including dynamic random access memory (DRAM), static random access memory (SRAM), register files, or a combination thereof, coupled to the read/write channel 104 and the control interface 106 to be used as a temporary storage location for processing the user data 128. It is understood that raw data 124, the corrected data 126, and the user data 128 can be transient information located anywhere in the local data storage 108.

The non-volatile memory array 102 can be a matrix of interconnected non-volatile memory integrated circuits, such as NAND flash array of single level cells (SLC) or multi-level cells (MLC) or another non-volatile memory technology. The cells in the non-volatile memory array 102 are organized into a plurality of a processed data page 110, which can be the smallest units for write and read operations. Reading the cells in a raw data page 112 is done by comparing their stored voltage with a threshold voltage "t". The read operation returns a binary vector with one bit for each cell: 1 for voltages lower than t and 0 for higher voltages. However, some cells can be misclassified, introducing errors in the bit values read. The choice of a read threshold can be utilized to minimize the bit error rate (BER) in the reads. The processed data page 110 can be corrected by using error correction codes (ECC), low density parity checks (LDPC), or other data structure techniques.

The read/write channel 104 can be a hardware structure, which can be supported by software, to encode and decode the user data 128 for storage in the non-volatile memory array 102. The read/write channel 104 can also retrieve the raw data page 112 from the non-volatile memory array 102 to be stored in the local data storage 108 as raw data 124. The raw data 124 can have correctable errors that will be addressed by an error recovery (ER) circuitry 120 in order to generate the corrected data 126. The ER circuitry 120 can perform error correction processes, such as parity correction, ECC processing, low density parity check (LDPC), or other error correction processes, on the raw data 124 to produce the corrected data 126.

Another aspect of the read/write channel 104 is the writing the processed data page 110 into the non-volatile memory array 102. The read/write channel 104 can retrieve user data 128 from the local data storage 108 and prepare the user data 128 for writing into the non-volatile memory array 102 as the processed data page 110. The read/write channel 104 can encode the user data 128 by adding error correction information and scrambling the individual bits before writing the processed data page 110 into the non-volatile memory array 102.

The raw data page 112 and the processed data page 110, that are in the same physical block 113, such as an erasure unit, can have similar electrical characteristics. As an example, the processed data page 110 and the raw data page 112 within the same physical block 113 can have the same number of program/erase cycles, retention times, and usually have the same read disturb characteristics. The physical block 113 can have similar voltage shifting patterns, and have similar raw bit error rate (RBER) for the processed data page 110 and the raw data page 112 if they are read with same read threshold value.

The control interface 106 can include a bus controller unit 116 supported by a control processor unit 114. The control processor unit 114 can be implemented with hardware circuitry in a number of different manners. For example, the control processor unit 114 can be a processor, an application specific integrated circuit (ASIC), an embedded processor, a microprocessor, a hardware control logic, a hardware finite state machine (FSM), a digital signal processor (DSP), or a combination thereof. The control processor unit 114 can coordinate the operation of the storage system 100. The bus controller 116 can execute the movement of the user data 128 into and out of the storage system 100. The bus controller 116 can be implemented as a hardware control logic, a hardware finite state machine (FSM), or a programmable bus controller, that can provide data transport between the local data storage 108 and a system host (not shown).

The control processor unit 114 can manage the operation of the read/write channel 104 including performing calculations, optimizing the read threshold, and execution of interface commands delivered from the host system (not shown). The control processor unit 114 can record the read threshold used to access the raw data page 112 and can use the same read threshold when accessing the processed data page 110. The read/write channel 104 can include a threshold optimization unit 118, an error recovery (ER) circuitry 120, and a read/write circuitry 122. The threshold optimization unit 118 can be a hardware structure that can identify previously used read thresholds in common for the physical blocks 113. The control processor unit 114 can interact with the threshold optimization unit 118 in order to adjust the read threshold for achieving the best raw bit error rate (RBER) for the physical block 113. The control processor unit 114 can decode an interface command received through the bus controller 116 and set-up the identification of the raw data page 112 or the processed data page 110 that is to be accessed by the read/write channel 104. The control processor unit 114 can enable the read/write channel 104 to execute the interface command once the set-up is complete. It is understood that the read/write channel 104 can be implemented as a part of the control processor unit 114, as a separate hardware function, or part of the non-volatile memory array 102.

The ER circuitry 120 can provide a value for the RBER by reading the raw data page 112 into the local data storage 108, that has ECC correctable errors, correcting the errors in the raw data 124 and comparing raw data 124, such as the data physically read from the raw data page 112, with the corrected data 126 that has completed error correction by the ER circuitry 120. The ER circuitry 120 can maintain the read threshold value for all of the data pages 110 in the physical block 113. The read threshold of the physical block 113 can be communicated to the control processor unit 114 for possible optimization to reduce the RBER of the raw data page 112 addressed by the interface command being executed.

The ER circuitry 120 can also prepare to write the user data 128 by a scramble the data before it is written into the non-volatile memory array 102 in order to average the wearing of all the non-volatile cells. In common practice, the user data 128 are usually exclusive-OR (XOR) with a random binary sequence with half zeros and half ones independent from the user data 128. As results, the final data written into the non-volatile cells are binary sequences of half zeros and half ones (statistically, not exactly). This means, that when the size of raw data 124 from the raw data page 112 is large enough, the number of zeros should be very close to the number of ones.

The ER circuitry 120 can be used to encode intended or targeted data for providing error protection, error detection, error correction, redundancy, or a combination thereof. The ER circuitry 120 can be used to decode the raw data 124, stored in the local data storage 108, to recover the intended or corrected data 126 based on error detection, error correction, redundancy, or a combination of processes thereof.

For illustrative purposes, the storage system 100 will be described as utilizing the data reliability mechanism in storing and accessing information with NAND flash memory. However, it is understood that the storage system 100 can utilize the data reliability mechanism with other types of memory, such as resistive non-volatile memory, other types of flash or non-volatile memory, or a combination thereof.

It has been discovered that the control processor unit 114 can optimize the read threshold value for all of the raw data pages 112 in the physical block 113. This can allow the ER circuitry 120 to generate a correction model characterization 121, such as a log likelihood ratios (LLR), based on a single hard read of the raw data page 112. By minimizing the number of the hard reads performed on the raw data page 112, the degradation in the RBER can also be minimized. The correction model characterization 121 can be an appropriate correction factor for any of the raw data pages 112 in the physical block 113.

Figure 2:
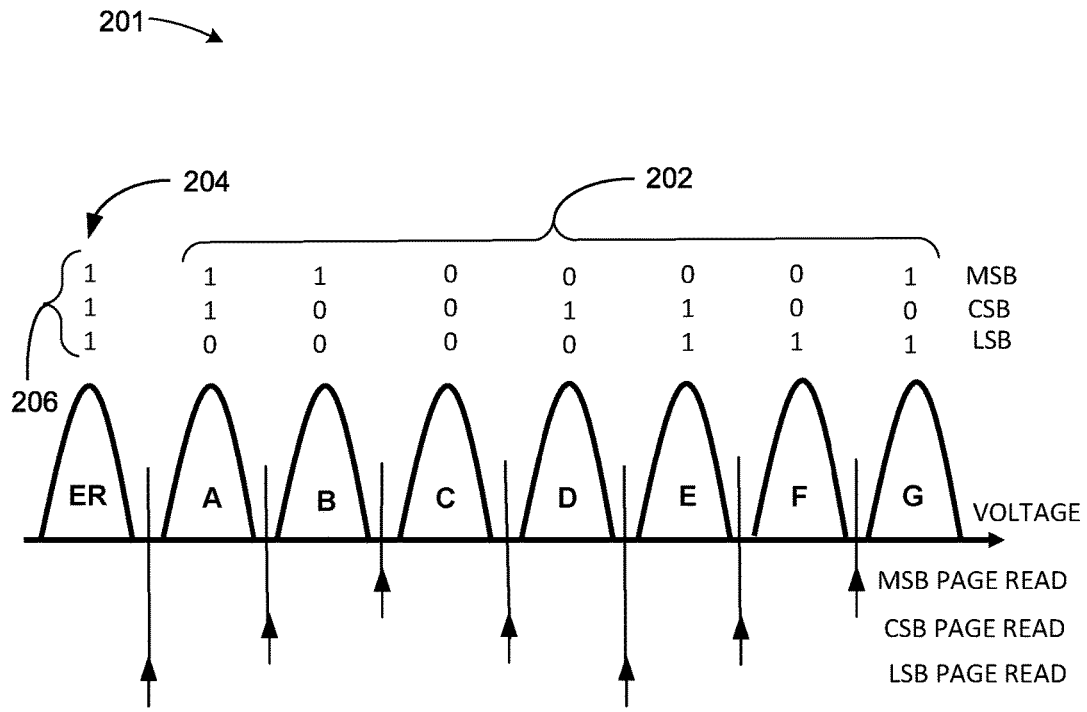
FIG. 2 depicts an architectural view of an exemplary access of a multi-level cell NAND flash page.

Referring now to FIG. 2, therein is shown an architectural view of an exemplary read 201 of a multi-level cell (MLC) NAND flash page. The architectural view of the exemplary access 201 depicts accessing 7 data bits 202 and an error recovery bit 204 accessed by 3 successive hard reads for detecting the MLC data.

In a b-bit MLC flash, each cell stores one of $2^b$ distinct predefined voltage levels. When each cell stores multiple bits, i.e. b≥2, the mapping of information bits to voltage levels is done using Gray coding to ensure that only one bit changes between adjacent levels. This is done because errors are most likely to occur between adjacent levels. Gray coding minimizes the average BER. Furthermore, each of the b bits is assigned to a different page.

It is understood that only a portion of the access of the raw data page 112 of FIG. 1 is shown. This is for ease of understanding and brevity. Each access can involve one or more of the raw data page 112. The output data 206 can be assembled by the ER circuitry 120 and stored in the raw data 124, held in the local data storage 108 of FIG. 1. Once the output data 206 has been assembled as the raw data 124, the ER circuitry 120 can analyze the raw data 124 for input to a specific decoding technique, such as low density parity check (LDPC).

Figure 3:
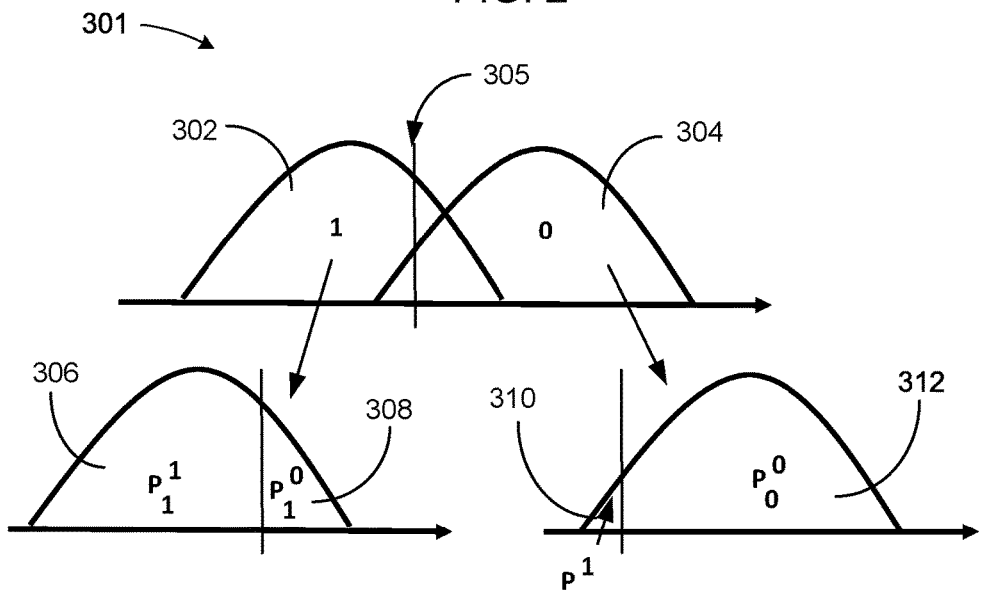
FIG. 3 is a statistical probability diagram for a NAND flash cell single access in an embodiment.

Referring now to FIG. 3, therein is shown a statistical probability diagram 301 for a NAND flash cell single access in an embodiment. The statistical probability diagram 301 depicts a cell written as a "1" as a statistical 1 profile 302 and a cell written as a "0" a statistical 0 profile 304. The statistical 1 profile 302 and the statistical 0 profile 304 can represent the voltage distribution of the cells, in the physical block 113 of FIG. 1 of the non-volatile memory array 102, written as a 1 or 0 respectively. The read threshold 305 can be set or optimized by the control processor unit 114 of FIG. 1. The read threshold 305 is a voltage level that establishes the reference for determining a value of the bit or bits stored in a non-volatile memory cell.

The cell written as a "1" shown as the statistical 1 profile 302 can be divided by the read threshold 305 into probability density functions (pdf). A single read between two adjacent voltage levels can be displayed as the curves, which are the plots of actual voltage distribution of corresponding written voltage. Hence, the area under each curve is exactly one. The read threshold 305 intersects the cell written as a "1" the statistical 1 profile 302 and the cell written as a "0" shown as the statistical 0 profile 304. This intersection can define If the voltage is less than the read threshold, i.e., on the left side of the red line, the readout value is 1, otherwise the readout value is 0. $P_1^1$ 306 is the area of the left side of the read threshold 305 and under the curve $P_1^1$ 306, which is the probability of writing 1 and reading out 1. $P_1^0$ 308 is the area of the right side of the read threshold 305 and under the curve $P_1^0$ 308, which is the probability of writing 1 and readout 0 that can be a correctable error. Hence, we have $P_1^1 + P_1^0 = 1$ according the property of pdf. $P_0^1$ 310 is the area of the left side of the read threshold 305 and under the curve $P_0^1$ 310, which is the probability of writing 0 and readout 1 that can be another instance of the correctable error. $P_0^0$ 312 is the area of the right side of the read threshold 305 and under the curve $P_0^0$ 312, which is the probability of writing 0 and readout 0. Hence, we have $P_0^1 + P_0^0 = 1$ as well.

The readout error probability, RBER ε, now can be written as:

$$\varepsilon = \frac{P_0^1 + P_1^0}{P_1^1 + P_1^0 + P_0^1 + P_0^0} = \frac{P_0^1 + P_1^0}{2} \qquad \text{Equation 1}$$

We assume that the ratio of 1's is θ, 0≤θ≤1, so the ratio of 0's is 1-θ. Based on the scramble process of the ER circuitry 120 of FIG. 1, the number or 1's and 0's should be about equal. And the ratio of readout 1's can be represented as:

$$\theta = \frac{P_0^1 + P_1^1}{P_1^1 + P_1^0 + P_0^1 + P_0^0} = \frac{P_0^1 + P_1^1}{2} \qquad \text{Equation 2}$$

Also based on the probability density functions (pdf) we have the following:

$$P_1^1 + P_1^0 = 1 \qquad \text{Equation 3}$$

And $$P_0^1 + P_0^0 = 1 \qquad \text{Equation 4}$$

Since ε and θ are known values that are determined by the processing of the ER circuitry 120, the above 4 linear equations form a system of linear equations of 4 unknowns, which can be solved as:

$$P_1^1 = \theta - \varepsilon + \frac{1}{2} \qquad \text{Equation 5}$$

$$P_1^0 = \varepsilon - \theta + \frac{1}{2} \qquad \text{Equation 6}$$

-continued $$P_0^1 = \theta + \varepsilon - \frac{1}{2} \qquad \text{Equation 7}$$

$$P_0^0 = \frac{3}{2} - \theta - \varepsilon \qquad \text{Equation 8}$$

The correction model characterization 121 of readout 1, denoted as L(1), is then computed by the ER circuitry 120 as:

$$L(1) = \log\frac{Pr(w=0 \mid r=1)}{Pr(w=1 \mid r=1)} = \log\frac{P_0^1}{P_1^1} = \log\frac{\theta + \varepsilon - \frac{1}{2}}{\theta - \varepsilon + \frac{1}{2}} \qquad \text{Equation 9}$$

where Pr (w=x|r=y), x, y∈{0,1} represents the probability of writing x and reading out y.

Similarly, the correction model characterization 121 of readout 0, denoted as L(0), is then computed by the ER circuitry 120 as:

$$L(0) = \log\frac{Pr(w=0 \mid r=0)}{Pr(w=1 \mid r=0)} = \log\frac{P_0^0}{P_1^0} = \log\frac{\frac{3}{2} - \theta - \varepsilon}{\varepsilon - \theta + \frac{1}{2}} \qquad \text{Equation 10}$$

It has been discovered that the storage system 100 can calculate the correction model characterization 121 for the raw data 124 of FIG. 1, based on the RBER, ε, and the ratio of 1's, θ. The ability to quickly process the raw data 124 based on submitting L(0) and L(1) to a soft decoding process, such as LDPC, ECC, parity, or the like, can minimize the number of hard reads performed on each cell as well as dramatically reduce data processing time. The values of the L(0) and the L(1) can be held constant for the any of the raw data page 112 that is within the physical block 113, further improving the performance of the storage system 100.

Figure 4:
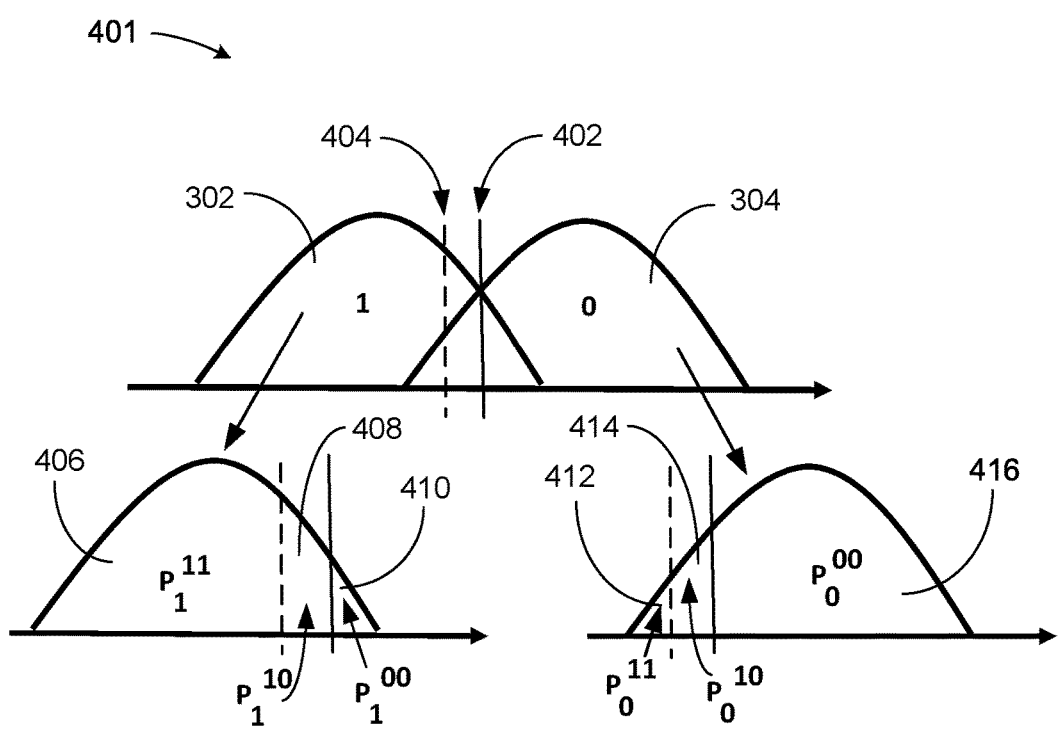
FIG. 4 is a statistical probability diagram for a NAND flash cell multiple access in an embodiment.

Referring now to FIG. 4, therein is shown a statistical probability diagram for a NAND flash cell multiple access in an embodiment. The statistical probability diagram 401 depicts a cell written as a "1" shown as the statistical 1 profile 302 and a cell written as a "0" shown as the statistical 0 profile 304. A first read threshold 402 can be set or optimized by the control processor unit 114 of FIG. 1. The first read threshold 402 and a second read threshold 404 is a voltage level that establishes the reference for determining a value of the bit or bits stored in a non-volatile memory cell. The first read threshold 402 and the second read threshold 404 can be used independently or in combination to refine statistical information about the value of the bit or bits stored in a non-volatile memory cell. The second read threshold 404 can be selected in order to enhance the information available for error correction. It is understood that the use of two read thresholds is an example and can be generalized to include any number of additional reads of the data block with additional read thresholds.

The cell written as a "1" shown as the statistical 1 profile 302 can be divided by the first read threshold 402 and the second read threshold 404 into the probability density functions (pdf). In this example, when the voltage is less than read threshold, the readout is 1, and otherwise is 0. So, the two reads can output only three valid 2-bit binary sequences.

If the second read threshold 404 is a lower voltage than first read threshold 402, the three valid 2-bits are 11, 10, and 00. Similarly, if the second read threshold 404 is a higher voltage than the first read threshold 402, the three valid 2-bits are 11, 01, and 00. A single read between two adjacent voltage levels can be displayed as statistical voltage distribution curves, which are the plots of actual voltage distribution of corresponding written voltage. Hence, the total area under each curve is one. The first read threshold 402 and the second read threshold 404 can intersect the cell written as a "1" shown as the statistical 1 profile 302 and the cell written as a "0" shown as the statistical 0 profile 304.

If the voltage is less than the first read threshold 402 and the second read threshold 404, i.e., on the left side of the second read threshold 404, the readout value is 1 and indicated as $P_1^{11}$ 406 is the area of the left side of the second read threshold 404 and under the left bit probability curve, which is the probability of writing 1 and reading out 2-bit as 11. $P_1^{10}$ 408 is the area of between the first read threshold 402 and the second read threshold 404 and under the left probability curve, which is the probability of writing 1 and reading out 2-bit as 10. $P_1^{00}$ 410 is the area of the right side of the first read threshold 402 and under the left probability curve, which is the probability of writing 1 and reading out 2-bit as 00.

Similarly, $P_0^{11}$ 412 is the area on the left side of the second read threshold 404 and under the right probability curve, which is the probability of writing 0 and reading out 2-bit as 11. $P_0^{10}$ 414 is the area of between the first read threshold 402 and the second read threshold 404 and under the right probability curve, which is the probability of writing 0 and reading out 2-bit as 10. $P_0^{00}$ 416 is the area of the right side of the first read threshold 402 and under the: right probability curve, which is the probability of writing 0 and reading out 2-bit as 00.

According the property of pdf, we have $$P_1^{11} + P_1^{10} + P_1^{00} = 1 \qquad \text{Equation 11}$$

and $$P_0^{11} + P_0^{10} + P_0^{00} = 1 \qquad \text{Equation 12}$$

A $1^{st}$ read RBER $\varepsilon_1$ can be written as $$\varepsilon_1 = \frac{P_0^{11} + P_0^{10} + P_1^{00}}{2} \qquad \text{Equation 13}$$

and a $2^{nd}$ read RBER $\varepsilon_2$ can be written as $$\varepsilon_2 = \frac{P_0^{11} + P_0^{10} + P_1^{00}}{2} \qquad \text{Equation 14}$$

The ratio of 1's in $1^{st}$ read $\theta_1$ can be represented as $$\theta_1 = \frac{P_0^{10} + P_1^{10} + P_0^{11} + P_1^{11}}{2} \qquad \text{Equation 15}$$

and the ratio of 1's in $2^{st}$ read $\theta_2$ can be represented as $$\theta_2 = \frac{P_0^{11} + P_1^{11}}{2} \qquad \text{Equation 16}$$

It is understood that there are 6 unknowns ($P_1^{11}$, $P_1^{10}$, $P_1^{00}$, $P_0^{11}$, $P_0^{10}$, and $P_0^{00}$) and 6 linear equations. By solving these linear equations, the value of $P_1^{11}$, $P_1^{10}$, $P_1^{00}$, $P_0^{11}$, $P_0^{10}$, and $P_0^{00}$ can be computed with 1st read RBER $\varepsilon_1$, 2nd read RBER $\varepsilon_2$, ratio of 1's in 1st read $\theta_1$, and the ratio of 1's in 2st read $\theta_2$.

The LLR of 2-bits 11 from 2 reads, denoted as L(11), now can be computed as:

$$L(11) = \log\frac{Pr(w=0|r=11)}{Pr(w=1|r=11)} = \log\frac{P_0^{11}}{P_1^{11}} \qquad \text{Equation 17}$$

where $Pr(w=x|r=y)$ represents the probability of writing x and reading out y.

Similarly, the LLR of 2-bits 10 from 2 reads, denoted as L(10), is then computed as $$L(10) = \log\frac{Pr(w=0|r=10)}{Pr(w=1|r=10)} = \log\frac{P_0^{10}}{P_1^{10}} \qquad \text{Equation 18}$$

and the LLR of 2-bits 00 from 2 reads, denoted as L(00), is then computed as $$L(00) = \log\frac{Pr(w=0|r=00)}{Pr(w=1|r=00)} = \log\frac{P_0^{00}}{P_1^{00}} \qquad \text{Equation 19}$$

To make it complete, we assign invalid read out sequence with zero LLR, $$L(01)=0$$

By comparing the LLR generation steps from single read, two reads, or more reads described above, it is understood that, when adding one more read, there are two more unknowns, i.e., the probability corresponding to the division by the new read threshold. In the meantime, there are also two more known values, i.e., the RBER and the ratio of 1's corresponding to any additional read threshold.

For n reads, there are 2(n+1) unknown probabilities, and we can form n linear equations with n RBER, $\varepsilon_1$, $\varepsilon_2$, ..., $\varepsilon_n$, another n linear equations with n different ratios of 1's, $\theta_1$, $\theta_2$, ..., $\theta_n$, plus two more linear equations that summing up corresponding probabilities into one. Hence, there are 2n+2 linear equations to solve 2n+2 unknowns. This system of linear equations always has at least one solution. In this way, the LLR can be computed for any number of reads.

It has been discovered that the storage system 100 can calculate the correction model characterization 121 for the raw data 124 of FIG. 1, based on the RBER, $\varepsilon$, and the ratio of 1's, $\theta$. The ability to quickly process the raw data 124 based on submitting L(0) and L(1) to a soft decoding process, such as LDPC, ECC, parity, or the like, can minimize the number of hard reads performed on each cell as well as dramatically reduce data processing time. The values of the L(00), L(01), L(10), and the L(11) can be held constant for the any of the raw data page 112 that are within the physical block 113, further improving the performance of the storage system 100.

Figure 5:
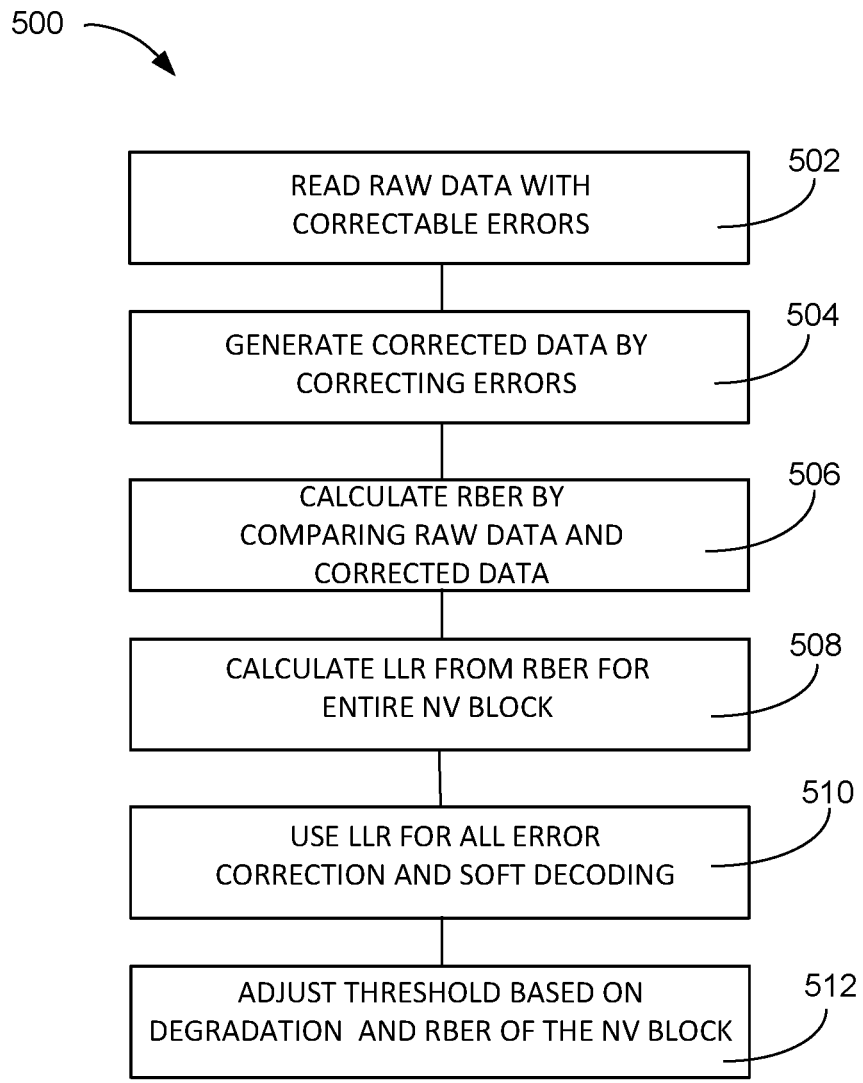
FIG. 5 is an operational flow diagram of the storage system with data reliability mechanism in an embodiment of the present invention.

Referring now to FIG. 5, therein is shown an operational flow diagram of the storage system with data reliability mechanism in an embodiment of the present invention. It is understood that the functions described in this application can be implemented as instructions stored on a non-transitory computer readable medium to be executed by a host processor, not shown, the control processor unit 114 of FIG. 1, or a combination thereof.

The non-transitory computer readable medium can include compact disk (CD), digital video disk (DVD), or universal serial bus (USB) flash memory devices. The non-transitory computer readable medium can be integrated as a part of a host system not shown or installed as non-volatile storage array 102 of the storage system 100.

The non-transitory computer readable medium can include instructions required to perform the operations of "reading raw data with correctable errors" 502. The correctable errors can be corrected by processes, such as parity correction, ECC processing, low density parity check (LDPC), or other error correction processes. The flow includes generating the corrected data 126 of FIG. 1 by correcting the correctable errors 504. The raw data 124 of FIG. 1 and the corrected data 126 can be stored a temporary data in the local data storage 108 of FIG. 1.

The flow can include "calculating a raw bit-error-rate (RBER) by comparing the raw data and the corrected data 506, as exemplified by equation 1 and equation 13. The comparison of the raw data 124 and the corrected data 126 can provide the RBER for the entire physical block of the non-volatile memory.

The flow includes "calculating an LLR from the RBER for the entire NV block" 508, as exemplified by equation 9 and equation 10. The physical block of the non-volatile memory can have the same RBER because the physical block can be subjected to a similar number of writes, reads, erasures, and wear leveling. Base on the physical architecture of the non-volatile memory, the charge of the entire physical block can be depleted at a common rate.

The flow includes "use LLR for all error correction and soft decoding" 510. The LLR generated from the RBER and the ratio of 1's in the corrected data 126. The LLR can apply to all of the raw data pages 112 of FIG. 1 in the physical block 113 of FIG. 1.

The flow can include "adjust the threshold based on degradation and RBER of the NV block" 512. It is understood that the control processor unit 114 of FIG. 1 can adjust the read threshold 305 of FIG. 3 in order to track changes in the physical block 113 of the non-volatile storage array 102. The control processor unit 114 can monitor the effectiveness of a correction process and make adjustments in order to maintain the peak efficiency of the storage system 100.

It has been discovered that the storage system 100 can increase performance when accessing the raw data pages 112. The application of a common LLR, including L(0) as shown in equation 9 and L(1) as shown in equation 10, can accelerate the correction of data from the physical block 113 of the non-volatile storage array 102. The control processor 114 can maintain a list of the correction values for all of the physical block 113 active within the non-volatile storage array 102.

Figure 6:
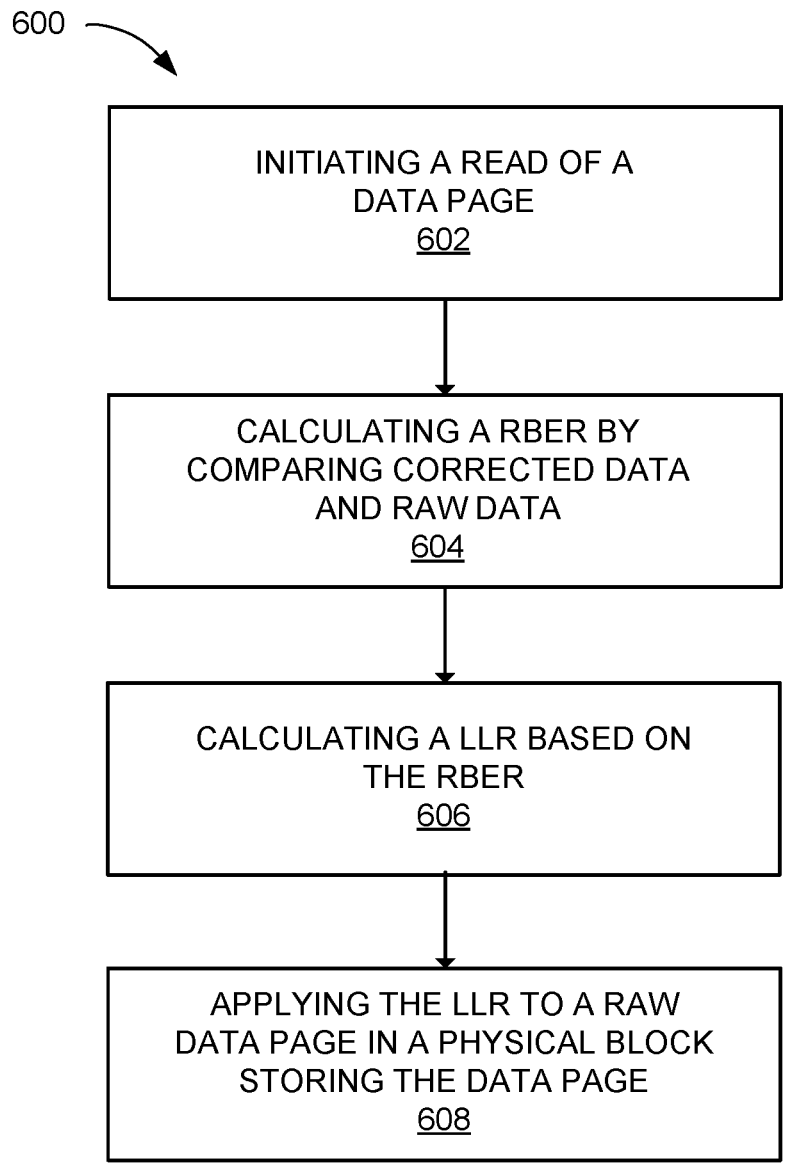
FIG. 6 is a flow chart of a method of operation of a storage system in an embodiment of the present invention.

Referring now to FIG. 6, therein is shown a flow chart of a method 600 of operation of a storage system 100 in an embodiment of the present invention. The method 600 includes: initiating a read of a data page, including correctable errors in a block 602; calculating a raw bit error rate (RBER) by correcting the correctable errors in a raw data to become corrected data and comparing raw data with the corrected data in a block 604; calculating a correction model characterization based on the RBER in a block 606; and applying the correction model characterization to the raw data page in a physical block in a block 608.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization. Another important aspect of an embodiment of the present invention is that it valuably supports and services the historical trend of reducing costs, simplifying systems, and increasing performance.

These and other valuable aspects of an embodiment of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters set forth herein or shown in the accompanying drawings are to be interpreted in an illustrative and non-limiting sense.

What is claimed is:

1. A storage system comprising:
    a control processor unit, configured to:
        initiate a read of a raw data page, having correctable errors,
        calculate a raw bit error rate (RBER) (EQ1) by correcting the correctable errors to become corrected data and comparing raw data with the corrected data, and
        calculate a correction model characterization based on the RBER (EQ1); and
    a non-volatile storage array, coupled to the control processor unit, configured to store a processed data page in a physical block with the raw data page; and
    wherein the control processor unit is further configured to apply the correction model characterization to the raw data page in the physical block.

2. The system as claimed in claim 1 wherein the control processor unit accesses an error recovery (ER) circuitry configured to read the raw data and generate the corrected data.

3. The system as claimed in claim 1 wherein the control processor unit is further configured to encode user data to include a similar or equal number of 0's and 1's when written to the processed data page in the non-volatile storage array.

4. The system as claimed in claim 1 wherein the control processor unit is further configured to maintain the read threshold for the raw data pages in the physical block.

5. The system as claimed in claim 1 further comprising a local data storage, coupled to a control interface, configured to store user data for encoding by the control processor unit.

6. The system as claimed in claim 1 wherein the control processor unit is further configured to calculate a ratio of readout 1's (EQ2) for generating the correction model characterization as L(1) (EQ9) and L(0) (EQ10).

7. The system as claimed in claim 1 wherein the control processor unit is further configured to calculate probability density functions (pdf) as $P_1^1$ (EQ5), $P_1^0$ (EQ6), $P_0^1$ (EQ7), and $P_0^0$ (EQ8).

8. The system as claimed in claim 1 wherein the control processor unit is further configured to load the raw data in a local data storage for processing the corrected data.

9. The system as claimed in claim 1 wherein the control processor unit is further configured to generate the correction model characterization with only a single execution of the read of the raw data page.

10. The system as claimed in claim 1 wherein the control processor unit is further configured to calculate L(0) (EQ10) and L(1) (EQ9) for use by a soft decoding process.

11. A method of operation of a storage system comprising:
    initiating a read of a raw data page, including correctable errors;
    calculating a raw bit error rate (RBER) (EQ1) by correcting the correctable errors in raw data to become corrected data and comparing the raw data with the corrected data;
    calculating a correction model characterization based on the RBER (EQ1); and
    applying the correction model characterization to the raw data page in a physical block.

12. The method as claimed in claim 11 further comprising reading the raw data into a local data storage and generating the corrected data.

13. The method as claimed in claim 11 further comprising encoding the user data to include a similar or equal number of 0's and 1's when written to the processed data page in the non-volatile storage array.

14. The method as claimed in claim 11 further comprising maintaining a read threshold for the raw data pages in the physical block.

15. The method as claimed in claim 11 further comprising storing user data in a local data storage for encoding by the control processor unit.

16. The method as claimed in claim 11 further comprising calculating a ratio of readout 1's (EQ2) for generating the correction model characterization as L(1) (EQ9) and L(0) (EQ10).

17. The method as claimed in claim 11 further comprising calculating probability density functions (pdf) as $P_1^1$ (EQ5), $P_1^0$ (EQ6), $P_0^1$ (EQ7), and $P_0^0$ (EQ8).

18. The method as claimed in claim 11 further comprising loading the raw data in a local data storage for processing the corrected data.

19. The method as claimed in claim 11 further comprising generating the correction model characterization with only a single execution of the read of the raw data page.

20. The method as claimed in claim 11 further comprising calculating L(0) (EQ10) and L(1) (EQ9) for use by a soft decoding process.

21. A non-transitory computer readable medium including instructions for execution, the medium comprising:
    initiating a read of a raw data page, including correctable errors;
    calculating a raw bit error rate (RBER) (EQ1) by correcting the correctable errors in raw data to become corrected data and comparing the raw data with the corrected data;
    calculating a correction model characterization based on the RBER (EQ1); and
    applying the correction model characterization to the raw data page in a physical block.

22. The medium as claimed in claim 21 further comprising reading the raw data into a local data storage and generating the corrected data.

23. The medium as claimed in claim 21 further comprising encoding the user data to include a similar or equal number of 0's and 1's when written to the processed data page in the non-volatile storage array.

24. The medium as claimed in claim 21 further comprising maintaining a read threshold for the raw data pages in the physical block.

25. The medium as claimed in claim 21 further comprising storing user data in a local data storage for encoding by the control processor unit.

26. The medium as claimed in claim 21 further comprising calculating a ratio of readout 1's (EQ2) for generating the correction model characterization as $L(1)$ (EQ9) and $L(0)$ (EQ10).

27. The medium as claimed in claim 21 further comprising calculating probability density functions (pdf) as $P_1^1$ (EQ5), $P_1^0$ (EQ6), $P_0^1$ (EQ7), and $P_0^0$ (EQ8).

28. The medium as claimed in claim 21 further comprising loading the raw data in a local data storage for processing the corrected data.

29. The medium as claimed in claim 21 further comprising generating the correction model characterization with only a single execution of the read of the raw data page.

30. The medium as claimed in claim 21 further comprising calculating $L(0)$ (EQ10) and $L(1)$ (EQ9) for use by a soft decoding process.

* * * * *